(12) United States Patent
Park et al.

(10) Patent No.: US 7,410,881 B2
(45) Date of Patent: Aug. 12, 2008

(54) METHOD OF MANUFACTURING FLASH MEMORY DEVICE

(75) Inventors: Sun Mi Park, Icheon-si (KR); Yoo Nam Jeon, Seongnam-si (KR); Nam Kyeong Kim, Icheon-si (KR); Se Jun Kim, Changwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/618,702

(22) Filed: Dec. 29, 2006

(65) Prior Publication Data

US 2007/0207580 A1 Sep. 6, 2007

(30) Foreign Application Priority Data

Mar. 2, 2006 (KR) ............... 10-2006-0019968
Apr. 25, 2006 (KR) ............... 10-2006-0037222

(51) Int. Cl.
*H01L 21/76* (2006.01)

(52) U.S. Cl. ............... 438/430; 438/672; 438/675; 438/700; 257/E21.577; 257/E21.585

(58) Field of Classification Search ............... 438/429; 257/E21.249
See application file for complete search history.

(56) References Cited

U.S. PATENT DOCUMENTS

2003/0071321 A1* 4/2003 Hong ............... 257/499
2005/0285177 A1* 12/2005 Shone ............... 257/315
2007/0020820 A1* 1/2007 Chindalore et al. ......... 438/142

FOREIGN PATENT DOCUMENTS

| KR | 100211536 B1 | 5/1999 |
| KR | 100268935 B1 | 7/2000 |
| KR | 1020020002739 A | 1/2002 |
| KR | 1020020094977 A | 12/2002 |
| KR | 1020030042106 A | 5/2003 |
| KR | 1020040080599 A | 9/2004 |
| KR | 100645839 B1 | 11/2006 |
| KR | 100734680 B1 | 6/2007 |

\* cited by examiner

*Primary Examiner*—Michael S. Lebentritt
*Assistant Examiner*—Cheung Lee
(74) *Attorney, Agent, or Firm*—Townsend and Townsend and Crew LLP

(57) ABSTRACT

A method of manufacturing a flash memory device includes etching an insulating layer provided over a substrate to form a contact hole to define a contact hole exposing a junction region formed on the substrate. The contact hole is filled with a first conductive material, the first conductive material contacting the junction region and extending above an upper surface of the contact hole. The first conductive material is etched to partly fill the contact hole, so that the first conductive material fills a lower portion of the contact hole, wherein an upper portion of the contact hole remains not filled due to the etching of the first conductive material, wherein the etched first conductive material defines a contact plug. A first dielectric layer and a second dielectric layer are formed over the contact plug, thereby filling the upper portion of the contact hole. Part of the first and second dielectric layers is etched to expose the contact plug and the upper portion of the contact hole. A second conductive material is formed on the contact plug and filling the upper portion of the contact hole to form a bit line.

19 Claims, 4 Drawing Sheets

METHOD OF MANUFACTURING FLASH MEMORY DEVICE

CROSS-REFERENCES TO RELATED APPLICATIONS

The present application claims priority to Korean patent application number 10-2006-19968, filed on Mar. 2, 2006 and Korean patent application number 10-2006-37222, filed on Apr. 25, 2006, which are incorporated by reference in its entirety.

BACKGROUND OF THE INVENTION

The present invention relates to a method of manufacturing a flash memory device.

The flash memory device has become highly integrated and multi-functional. Accordingly, the reduced size of the contact hole causes a difficulty in filling the contact hole. It also becomes difficult to lower the resistance of the drain contact plug. This makes it difficult to secure an alignment margin between the drain contact plug and the bit line.

BRIEF SUMMARY OF THE INVENTION

One embodiment of the present invention is directed towards a method of manufacturing a flash memory device, which can lower the defects due to misalignment by securing an alignment margin between a drain contact plug and a bit line using a method of partially removing only the top surface of a contact through a mask free selective etch process and a subsequent self-aligned etch method.

Another embodiment of the present invention is directed to a method of manufacturing a flash memory device, which can reduce the resistance of a drain contact plug and a contact resistance. This is done by filling a drain contact with a conductive layer, the conductive layer is etched to a depth, and a silicide layer and a metal layer are sequentially formed in the etched region, thus forming the drain contact plug.

In one embodiment, a method of manufacturing a flash memory device includes the steps of; forming an insulating layer over a semiconductor substrate in which specific structures including a junction region are formed; etching a part of the insulating layer to form contact holes and filling the contact holes with a first conductive material; etching the first conductive material to a specific depth; forming a nitride layer and an oxide layer on the entire surface, and etching a part of the nitride layer and the oxide layer using a self-aligned etch process, thus exposing the first conductive material; and forming a second conductive material on the entire surface including the exposed first conductive material.

In another embodiment, a method of manufacturing a flash memory device includes the steps of; forming a plurality of gates over a semiconductor substrate and forming a junction region over the semiconductor substrate between the gates; forming a first insulating layer on the entire surface, and etching a specific region of the first insulating layer to form a contact hole through which the junction region is exposed; forming a conductive layer in the contact hole, and etching the conductive layer to a depth; forming a silicide layer and a first metal layer in the etched region, thus forming a contact plug; forming a second insulating layer on the entire surface and then etching a specific region of the second insulating layer to expose the contact plug; and forming a barrier metal layer and a second metal layer on the entire surface.

In one embodiment, a method of manufacturing a flash memory device includes forming an insulating layer over a semiconductor substrate in which a junction region is defined. Part of the insulating layer is etched to form a contact hole exposing the junction region. The contact hole is filled with a first conductive material, the first conductive material contacting the junction region and extending above an upper surface of the contact hole. The first conductive material is etched to partly fill the contact hole, so that the first conductive material fills a lower portion of the contact hole, wherein an upper portion of the contact hole is not filled, wherein the etched first conductive material defines a contact plug. A nitride layer and an oxide layer are formed over the contact plug and filling the upper portion of the contact hole, the nitride layer being provided below the oxide layer. Part of the nitride layer and the oxide layer are etched to expose the contact plug and the upper portion of the contact hole. A second conductive material is formed on the contact plug and fills the upper portion of the contact hole to form a bit line, the bit line at least partly extending into the upper portion of the contact hole.

In another embodiment, a method of manufacturing a flash memory device includes forming a junction region between two gates on a semiconductor substrate. A first insulating layer is formed over the junction region and the gates. A specific region of the first insulating layer is etched to form a first contact hole to expose the junction region. A conductive layer is formed over the first insulating layer and the first contact hole, the conductive layer contacting the junction region and filling the first contact hole. The conductive layer is etched until the etched conductive layer within the first contact hole is provided with an upper surface that is below an upper surface of the first contact hole, thereby defining an upper portion of the first contact hole. A silicide layer and a first metal layer are formed within the upper portion of the first contact hole to form a contact plug. A second insulating layer is formed over the contact plug and the first insulating layer. A specific region of the second insulating layer is etched to from a second contact hole to expose the contact plug. A barrier metal layer and a second metal layer are formed within the second contact hole and the second insulating layer.

In yet another embodiment, a method of manufacturing a flash memory device includes etching an insulating layer provided over a substrate to form a contact hole to define a contact hole exposing a junction region formed on the substrate. The contact hole is filled with a first conductive material, the first conductive material contacting the junction region and extending above an upper surface of the contact hole. The first conductive material is etched to partly fill the contact hole, so that the first conductive material fills a lower portion of the contact hole, wherein an upper portion of the contact hole remains not filled due to the etching of the first conductive material, wherein the etched first conductive material defines a contact plug. A first dielectric layer and a second dielectric layer are formed over the contact plug, thereby filling the upper portion of the contact hole. Part of the first and second dielectric layers is etched to expose the contact plug and the upper portion of the contact hole. A second conductive material is formed on the contact plug and filling the upper portion of the contact hole to form a bit line.

DESCRIPTION OF SPECIFIC EMBODIMENTS

Specific embodiments according to the present patent will be described with reference to the accompanying drawings.

Figure 1:
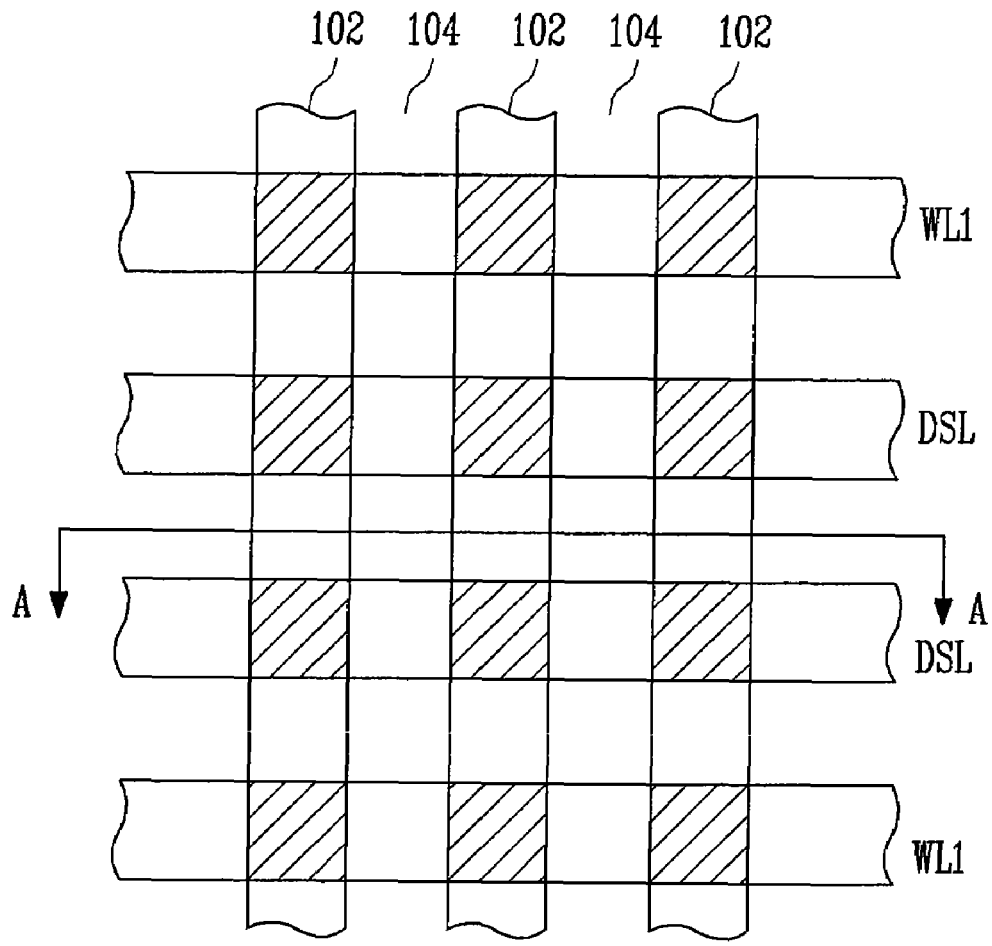
FIG. 1 is a plan view illustrating a part of a cell array region of a flash memory device.

FIG. 1 is a plan view illustrating a part of a cell array region of a flash memory device. FIGS. 2A to 2D are cross-sectional views of the flash memory device taken along line A-A in FIG. 1 for describing a method of manufacturing a flash memory device according to a first embodiment of the present invention.

Referring to FIG. 1, a flash memory device includes cells, which are connected in series between a drain select transistor and a source select transistor in a string fashion on a 16 or 32 basis. Cells sharing the same word line are grouped and thus defined as one block.

Figure 2A:
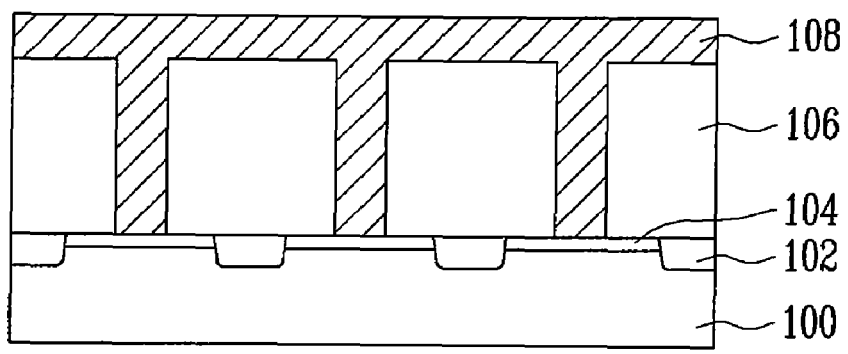
FIGS. 2A to 2D are cross-sectional views of the flash memory device along cut plane A-A in FIG. 1 in order to describe a method of manufacturing a flash memory device according to a first embodiment of the present invention.

Referring to FIG. 2A, a first insulating layer 106 is formed over a semiconductor substrate 100 in which isolation layers 102 and an active region 104 are defined.

The active region 104 includes a drain, and the first insulating layer 106 can be formed using material, such as BPSG, PSG, FSG, PE-TEOS, PE-SiH$_4$, HDP USG or APL. The first insulating layer 106 can be formed using one kind of material or a stack of two or more kinds of materials.

A part of the first insulating layer 106 is etched to form contact holes through which the active region 104 of the semiconductor substrate 100 is exposed. The contact holes are filled with a first conductive material 108. The first conductive material 108 may be formed of polysilicon.

Figure 2B:
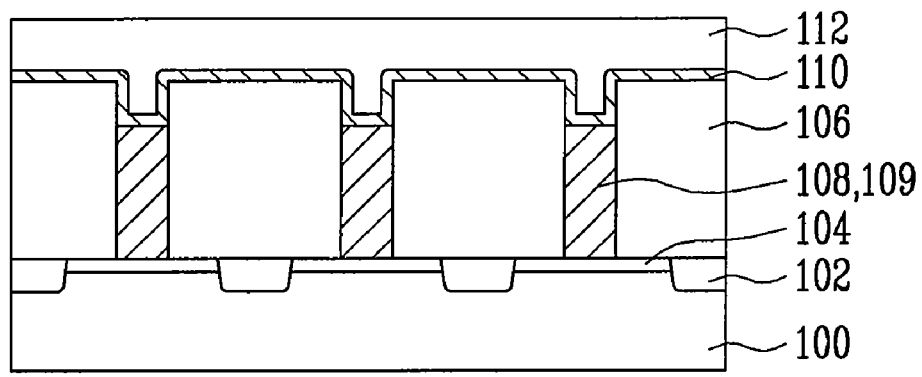

Referring to FIG. 2B, substantially all of the first conductive material 108 on the upper surface of the first insulating layer 106 is removed while leaving part of the conductive material 108 inside the contact holes using a selective etch process. The resulting first conductive material 108 fills lower portions of the contact holes and defines a drain contact plug 109. Upper portions of the contact holes are exposed and not filled. In particular, the first conductive material 108 (that is, a contact hole gap-fill material) is etched to a specific depth by means of a dry etch process. A gas having a high etch selectivity against polysilicon (i.e., an etch gas including $Cl_2$ or HBr) is used as the etch gas. A nitride layer 110 and an oxide layer 112 are sequentially formed on the entire surface for the purpose of insulation.

Figure 2C:
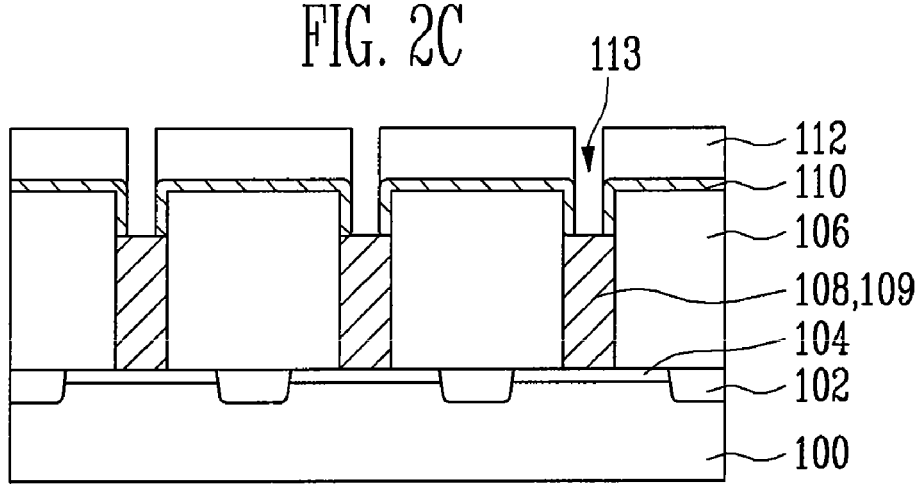

Referring to FIG. 2C, a self-aligned etch process is performed in order to secure alignment margin between the drain contact plug and a bit line. In more detail, a part of the nitride layer 110 and the oxide layer 112 is removed by a self-aligned etch process considering the etch selectivity, thus forming an opening 113 that exposes the drain contact plug. When the oxide layer 112 is removed, a mixed etch gas including $C_5F_8$, Ar or $O_2$ may be used. When the nitride layer 110 is removed, a mixed etch gas including $F_4$ or $CHF_3$ may be used. In the present embodiment, two different etch steps are used to etch the oxide layer 112 and the nitride layer 110.

In the above etch steps, a portion of the oxide layer 112 is removed to expose the contact holes while leaving the remaining portion of the oxide layer 112 over the upper surface of the first insulating layer 106. Similarly, a portion of the nitride layer 110 on the drain contact plug 109 is removed while leaving the remaining portion over the upper surface of the first insulating layer 106. In other words, portions of the oxide layer 112 and nitride layer 110 remain on or over the upper surface of the first insulating layer 106.

In addition, a portion of the nitride layer 110 remains on the sidewalls of the contact holes in the present embodiment. However, the nitride layer 110 may be removed from the sidewalls of the contact holes in other embodiments.

The self-alignment etch principle is described in above. Although misalignment may occur in the process of etching a part of the nitride layer 110 and the oxide layer 112 during the process explained in FIG. 2C, the location between the drain contact plug and the bit line is automatically aligned because the etch location has already been set by the process of etching the first conductive material 108 (that is, the contact hole gap-fill material) to a specific depth in the process step of FIG. 2B.

Figure 2D:
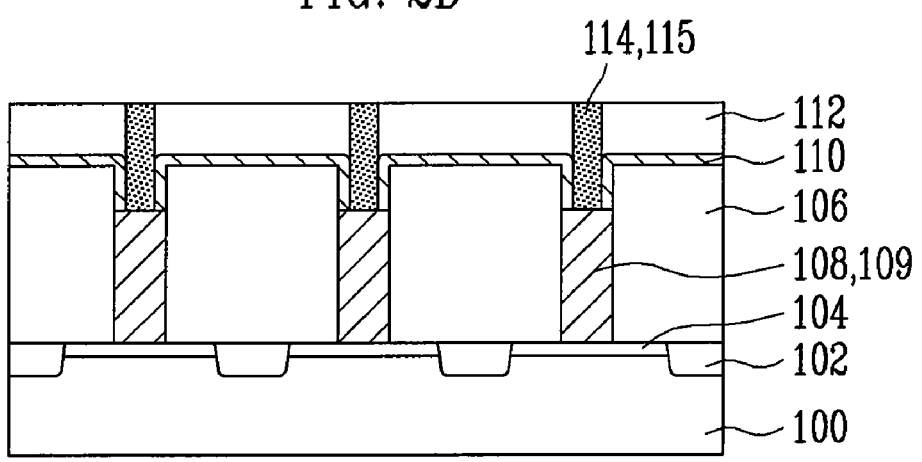

Referring to FIG. 2D, a second conductive material 114 is filled into opening 113 to contact the drain contact plug 109. A Chemical Mechanical Polishing (CMP) is then performed to form a bit line 115.

FIGS. 3A to 3D are cross-sectional views illustrating a method of manufacturing a flash memory device according to a second embodiment of the present invention.

Figure 3A:
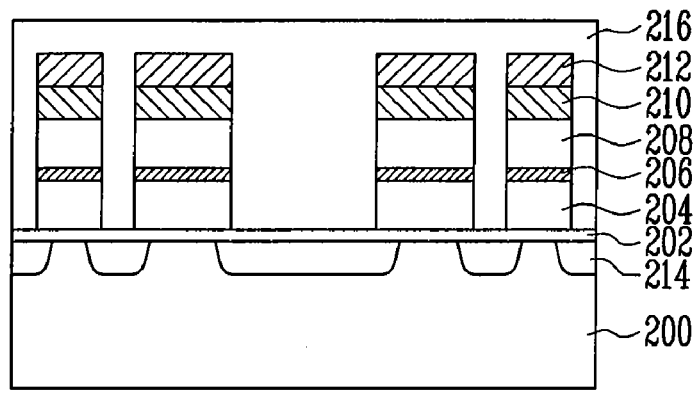
FIGS. 3A to 3D are cross-sectional views illustrating a method of manufacturing a flash memory device according to a second embodiment of the present invention.

Referring to FIG. 3A, a tunnel oxide layer 202, a first polysilicon layer 204, a dielectric layer 206, a second polysilicon layer 208, a tungsten silicide layer 210 and a hard mask layer 212 are laminated over a semiconductor substrate 200, and a floating gate and a control gate are laminated in a cell region, thus forming a gate electrode. At the same time, a gate electrode having the same structure is also formed for a select transistor.

The gate structure may incur plasma damage during the etch step to define the gate structure contact hole (e.g., on the sidewalls of the first and second polysilicon layers 204 and 208). An oxidization process is performed to form an oxide layer (not shown) on the sidewalls of the gate, preferably the sidewalls of the first and second polysilicon layers 204 and 208, to repair the plasma damage. An ion implantation process is then performed to form junction regions 214 serving as the source and drain regions.

Though not illustrated in the drawing, after a spacer is formed on the gate sidewalls of the select transistor region, a first buffer oxide layer and a SAC nitride layer can be formed on the entire surface. A first insulating layer 216 is formed on the surface in order to insulate between gate lines and provide insulation from upper lines. A CMP process is then performed.

Figure 3B:
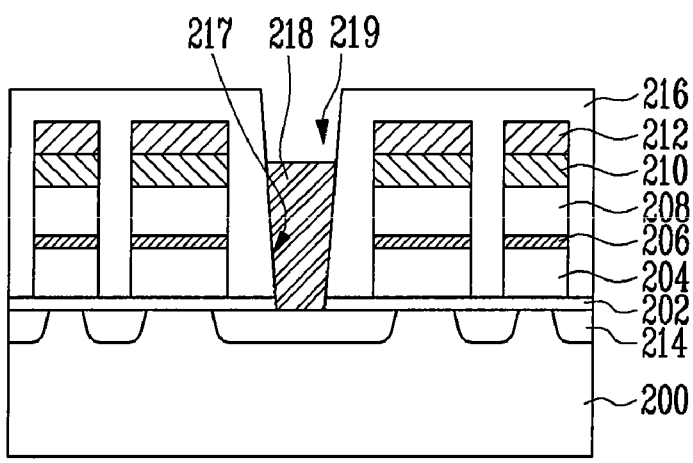

Referring to FIG. 3B, a specific region of the first insulating layer 216 is etched by a self-aligned contact etch process, thus forming a first contact hole 217 through which the drain or source region is exposed. A conductive layer 218 is formed of, for example, polysilicon in order to fill the first contact hole 217.

An etch process is performed to etch the conductive layer 218 to a depth of 500 to 5000 angstroms. That is, the etch process defines a second contact hole 219 with a depth of 500 to 5000 angstroms over the etched conductive layer 218.

Figure 3C:
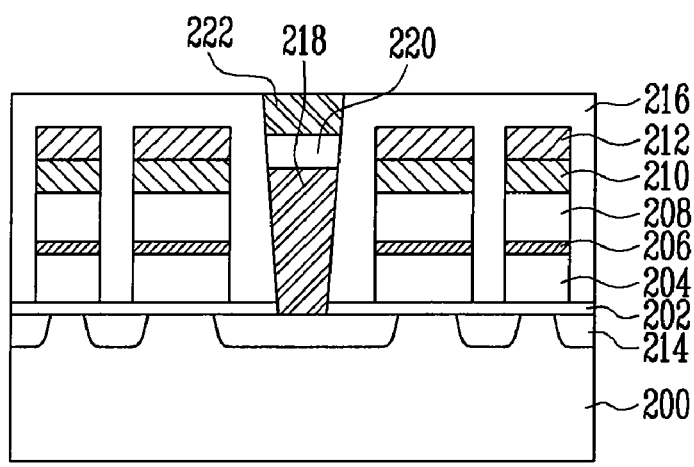

Referring to FIG. 3C, a silicide layer 220 having a thickness of 10 to 1000 angstroms is formed in the second contact hole 219 etched by the process of FIG. 3B, but is formed so that it is not higher than the first insulating layer 216 (i.e., the second contact hole 219 remains partly unfilled). An annealing process is then performed to crystallize the silicide layer 220.

In particular, the silicide layer 220 can be formed using one of Ti, Co, Pt, Ir and Ru. The annealing process is performed in a temperature range of 400 to 1500 Celsius degrees using a RTP or furnace method.

A first metal layer 222 is formed to fully gap-fill the contact holes. The first metal layer 222 can be formed using a conductive nitride layer, such as TiN, TaN or WN.

The deposition method of the silicide layer 220 and the first metal layer 222 may comprise a Chemical Vapor Deposition (CVD) or Atomic Layer Deposition (ALD) method.

As described above, if the first metal layer 222 is formed right on the conductive layer 218, the resistance of the contact plug is increased. Thus, if the silicide layer 220 is formed between the conductive layer 218 and the first metal layer 222 in order to form the contact plug, the resistance of the contact plug itself can be lowered significantly.

Figure 3D:
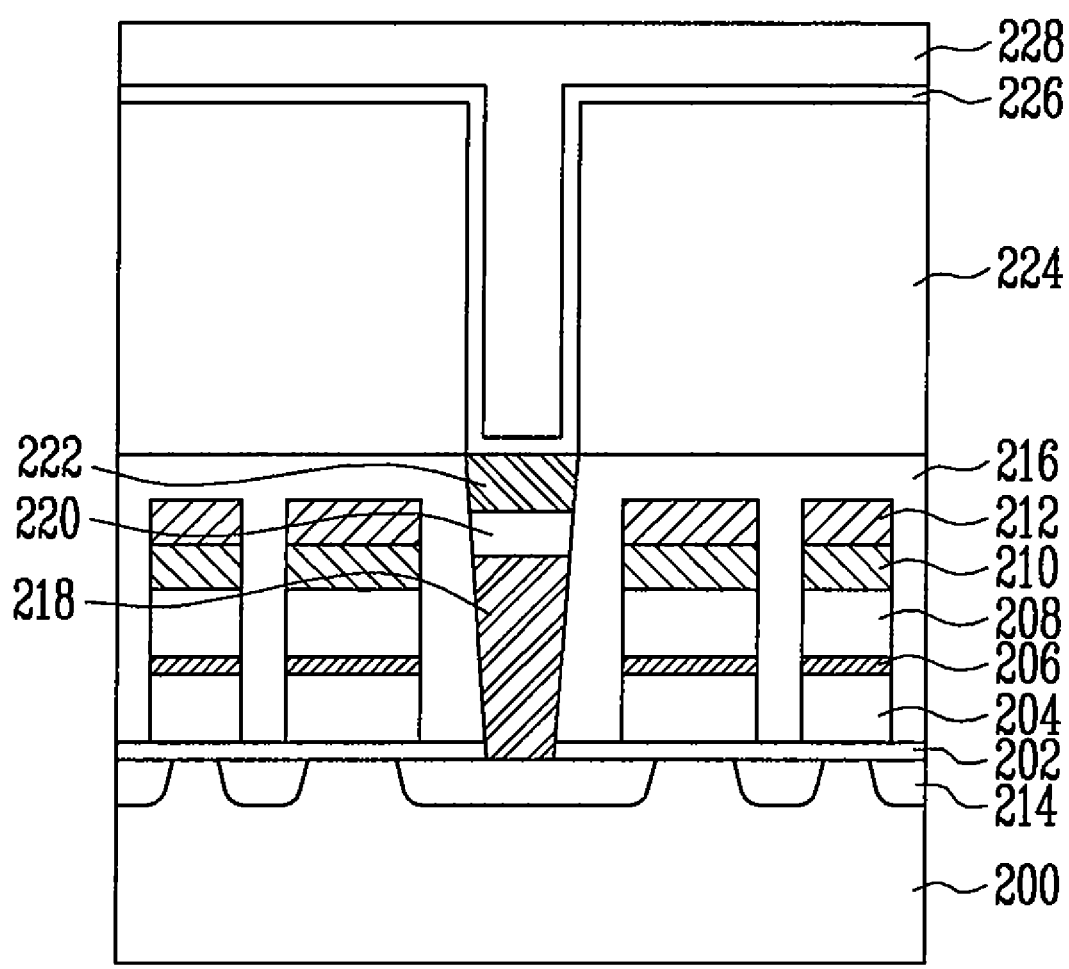

Referring to FIG. 3D, a second insulating layer 224 is formed on the entire surface. A specific region of the second insulating layer 224 is then etched to form a contact hole to expose the contact plug. A barrier metal layer 226 is formed using Ti or TiN on the surface, and a second metal layer 228 is then formed.

According to a first embodiment of the present invention, the alignment margin between the drain contact plug and the bit line can be obtained using the method of partially removing the top surface of the contact through a mask free selective etch process and a subsequent self-aligned etch method. Accordingly, the number of defects due to misalignment can be lowered.

According to a second embodiment of the present invention, the drain contact is filled with the conductive layer, the conductive layer is etched to a depth, and the silicide layer and the metal layer are sequentially formed in the etched region, thus forming the drain contact plug. It is therefore possible to reduce the resistance of the drain contact plug and the contact resistance.

The above embodiments of the present invention are illustrative and various alternatives are possible. Other additions, subtractions, or modifications are obvious in view of the present disclosure and are intended to fall within the spirit and scope of the appended claims.

What is claimed is:

1. A method of manufacturing a flash memory device, the comprising:
    forming an insulating layer over a semiconductor substrate in which a junction region is defined;
    etching a part of the insulating layer to form a contact hole exposing the junction region;
    filling the contact hole with a first conductive material, the first conductive material contacting the junction region and extending above an upper surface of the contact hole;
    etching the first conductive material to partly fill the contact hole, so that the first conductive material fills a lower portion of the contact hole, wherein an upper portion of the contact hole remains not filled, wherein the etched first conductive material defines a contact plug;
    forming a nitride layer and an oxide layer over the contact plug and filling the upper portion of the contact hole, the nitride layer being provided below the oxide layer;
    etching part of the nitride layer and the oxide layer to expose the contact plug and the upper portion of the contact hole; and
    forming a second conductive material on the contact plug and filling the upper portion of the contact hole to form a bit line, the bit line at least partly extending into the upper portion of the contact hole.

2. The method of claim 1, wherein the first conductive material comprises polysilicon.

3. The method of claim 1, wherein the first conductive material is etch using an etch gas including $Cl_2$ or HBr, or both.

4. The method of claim 1, wherein the second conductive material comprises tungsten (W) or aluminum (Al), or both.

5. The method of claim 1, wherein the oxide layer is etched using a mixed gas including $C_5F_8$, Ar and $O_2$ is used, and when the nitride layer is etched, an etch gas including $CF_4$ or $CHF_3$ is used.

6. The method of claim 1, wherein the contact plug is a drain contact plug, wherein a portion of the nitride layer remains on sidewalls of the upper portion of the contact hole when the second conductive material is filled into the upper portion of the contact hole.

7. A method of manufacturing a flash memory device, the method comprising:
    forming a junction region between two gates on a semiconductor substrate;
    forming a first insulating layer over the junction region and the gates;
    etching a specific region of the first insulating layer to form a first contact hole to expose the junction region;
    forming a conductive layer over the first insulating layer and the first contact hole, the conductive layer contacting the junction region and filling the contact hole;
    etching the conductive layer until the etched conductive layer within the first contact hole is provided with an upper surface that is below an upper surface of the first contact hole, thereby defining an upper portion of the contact hole;
    forming a silicide layer and a first metal layer within the upper portion of the first contact hole to form a contact plug;
    forming a second insulating layer over the contact plug and the first insulating layer;
    etching a specific region of the second insulating layer to from a second contact hole to expose the contact plug; and
    forming a barrier metal layer and a second metal layer within the second contact hole and the second insulating layer.

8. The method of claim 7, wherein the conductive layer is formed of polysilicon.

9. The method of claim 7, wherein the upper portion of the first contact hole has a depth of 500 to 5000 angstroms.

10. The method of claim 7, wherein the silicide layer is formed of Ti, Co, Pt, Ir, Ru, or a combination thereof.

11. The method of claim 7, wherein the silicide layer is formed to a thickness of 10 to 1000 angstroms, but is not higher than the first insulating layer.

12. The method of claim 7, further comprising performing an annealing process in a temperature range of 400 to 1500 degrees Celsius using a rapid thermal process method or a furnace method after the silicide layer is formed.

13. The method of claim 7, wherein the first metal layer is formed using a conductive nitride layer including at least TiN, TaN or WN.

14. The method of claim 7, wherein the silicide layer and the first metal layer are formed by a Chemical Vapor Deposition (CVD) or Atomic Layer Deposition (ALD) method.

15. The method of claim 7, wherein the barrier metal layer includes Ti, TiN, or both.

16. A method of manufacturing a flash memory device, the comprising:
    etching an insulating layer provided over a substrate to form a contact hole to define a contact hole exposing a junction region formed on the substrate;

filling the contact hole with a first conductive material, the first conductive material contacting the junction region and extending above an upper surface of the contact hole;

etching the first conductive material to partly fill the contact hole, so that the first conductive material fills a lower portion of the contact hole, wherein an upper portion of the contact hole remains not filled due to the etching of the first conductive material, wherein the etched first conductive material defines a contact plug;

forming a first dielectric layer and a second dielectric layer over the contact plug, thereby filling the upper portion of the contact hole;

etching part of the first and second dielectric layers to expose the contact plug and the upper portion of the contact hole; and forming a second conductive material on the contact plug and filling the upper portion of the contact hole to form a bit line.

17. The method of claim 16, wherein the bit line at least partly extending into the upper portion of the contact hole.

18. The method of claim 16, wherein the first and second dielectric layers are etched using different etch gases.

19. The method of claim 16, wherein the first dielectric layer is a nitride layer and the first dielectric layer is an oxide layer.

* * * * *